(12) United States Patent
Noro et al.

(10) Patent No.: US 6,437,719 B1
(45) Date of Patent: Aug. 20, 2002

(54) DELTA-SIGMA MODULATOR FOR POWER AMPLIFICATION OF AUDIO SIGNALS

(75) Inventors: Masao Noro; Makoto Kaneko, both of Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/931,369

(22) Filed: Aug. 16, 2001

(30) Foreign Application Priority Data

Aug. 18, 2000 (JP) ........................................ 2000-248864

(51) Int. Cl.[7] ........................... H03M 3/00; H04B 14/06
(52) U.S. Cl. ........................................ 341/143; 375/247
(58) Field of Search .................................. 341/143, 144; 332/103; 375/243, 247, 251; 702/141; 327/328

(56) References Cited

U.S. PATENT DOCUMENTS

| | | | |
|---|---|---|---|
| 4,264,974 A | 4/1981 | Crouse | |
| 5,610,606 A | 3/1997 | Fukunaga | |
| 5,920,273 A | * 7/1999 | Hirano | ........................ 341/144 |
| 5,974,089 A | * 10/1999 | Tripathi et al. | ............. 375/247 |
| 6,018,262 A | * 1/2000 | Noro et al. | ................. 327/328 |
| 6,097,259 A | 8/2000 | Saito | |

* cited by examiner

*Primary Examiner*—Patrick Wamsley
(74) *Attorney, Agent, or Firm*—Pillsbury Winthrop LLP (57) ABSTRACT

A delta-sigma modulator for use in power amplification of audio signals is configured by an integration circuit, a 1-bit quantizer, an output inversion inhibitor circuit, a delay circuit, and an adder. An analog signal is supplied to the integration circuit by way of the adder, wherein it is subjected to integration. An integration result is subjected to quantization by the 1-bit quantizer to produce 1-bit digital signals. The output inversion inhibitor circuit inhibits an output signal of the 1-bit quantizer from being re-inverted during a re-inversion inhibiting period corresponding to a preset number 'N' (where $N \geq 2$) of clock pulses counted after the timing when the output signal of the 1-bit quantizer is inverted. The output of the output inversion inhibitor circuit is delayed by one sample and is fed back to the adder by way of the delay circuit.

6 Claims, 7 Drawing Sheets

$(T=1/f_{CLK})$

DELTA-SIGMA MODULATOR FOR POWER AMPLIFICATION OF AUDIO SIGNALS

BACKGROUND OF THE INVENTION

1. Field of the Invention

This invention relates to delta-sigma (ΔΣ) modulators that are preferable for use in power amplification circuits of audio signals.

2. Description of the Related Art

Figure 7:
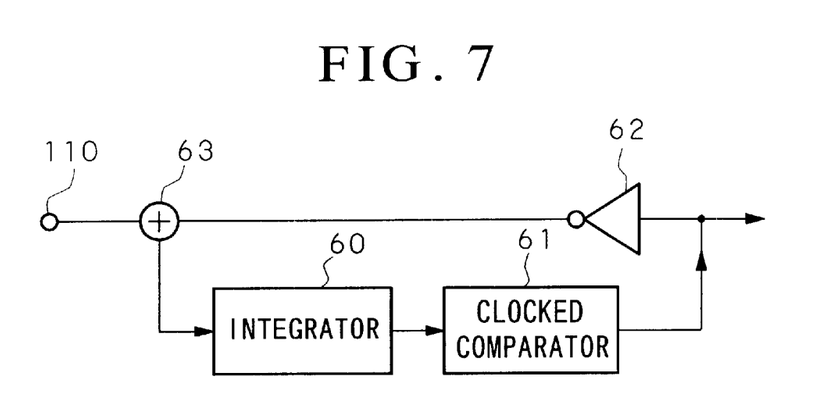
FIG. 7 is a simplified block diagram showing an example of a configuration of a delta-sigma modulator that is conventionally used for a power amplifier circuit of audio signals.

Conventionally, power amplifier circuits for audio signals are designed to perform power amplification by effecting pulse-width modulation (PWM) at their output stages, which yields a high efficiency in power amplification. In addition, it is possible to provide a delta-sigma modulator at an input stage of the power amplifier circuit for audio signals. Here-in, power amplification is performed such as to realize switching using an output of the delta-sigma modulator. FIG. 7 shows a simple circuit configuration for use in conventional delta-sigma modulators.

In FIG. 7, an analog signal is input to a signal input terminal 110 and is added together with an output of an inverter 62 by an adder 63. An output of the adder 63 is subjected to integration by an integrator 60, an integration result of which is forwarded to a clocked comparator 61. The clocked comparator 61 performs quantization in such a manner that the integration result of the integrator 60 is compared with the reference voltage in synchronization with a clock frequency $f_{CLK}$. That is, the clocked comparator 61 produces a 1-bit digital signal based on the integration result of the integrator 60 by quantization. Such an output of the clocked comparator 61 is delayed by one sample and is then fed back to the adder 63 by way of the inverter 62. That is, the inverter 62 acts as a feedback delay circuit for the delta-sigma modulator. As described above, the delta-sigma modulator of FIG. 7 is characterized in that the clocked comparator 61 outputs a series of 1-bit digital signals.

Figure 8:
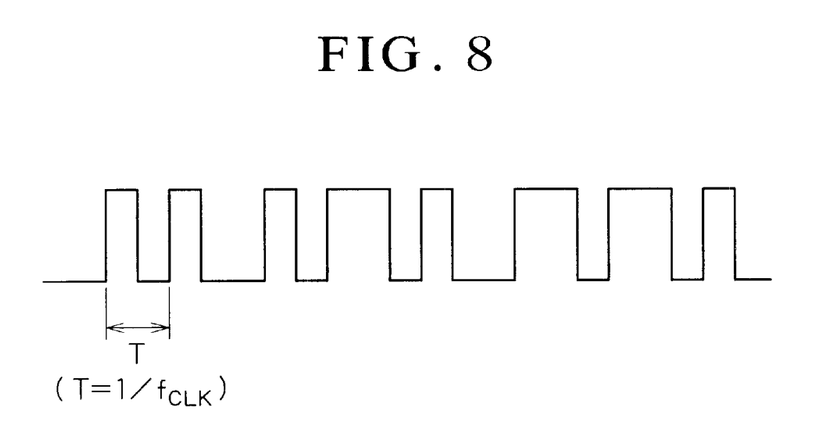
FIG. 8 shows a waveform consisting of pulses whose pulse widths are altered in synchronization with a clock frequency $f_{CLK}$.

The delta-sigma modulator performs analog-to-digital conversion based on an input analog signal to produce 1-bit digital signals based on comparison results of the clocked comparator 61, an example of which is shown in FIG. 8. FIG. 8 shows a string of pulses having pulse widths that are varied in response to comparison results of the clocked comparator 61. Therefore, the clocked comparator 61 outputs digital signals in such a discrete manner that their values are adequately altered between logic 0 and logic 1 with reference to a reference pulse width corresponding to the clock frequency $f_{CLK}$. Herein, the clocked comparator 61 uses the 'fixed' clock frequency $f_{CLK}$. In order to perform high-precision analog-to-digital conversion, it is necessary to perform so-called 'over-sampling' techniques. For this reason, it is necessary to increase the clock frequency to be sufficiently high.

In order that the aforementioned delta-sigma modulator produces digital signals at a sampling frequency fs of 48 kHz, for example, the clock frequency $f_{CLK}$ should be greatly increased in proportion to the sampling frequency fs in order to achieve high-precision analog-to-digital conversion. Here-in, the clock frequency $f_{CLK}$ should be normally increased to 64 fs or so, that is, 3 MHz.

To operate the delta-sigma modulator at the aforementioned clock frequency $f_{CLK}$, the clocked comparator 61 outputs 1-bit signals at a maximal inverse frequency, which is set at ½ $f_{CLK}$. Herein, the maximal inverse frequency is defined as a maximal value of the inverse number of the period by which an output of the clocked comparator 61 is inverted.

Switching 1-bit signals at a large power may cause various problems. That is, the switching loss becomes large as the maximal inverse frequency becomes high. In that case, the delta-sigma modulator must is subject to the problem of the heating of the switching elements. In addition, it also suffers from other problems due to electromagnetic radiation (or radiation of electromagnetic waves).

Due to the aforementioned problems, it may seem rational to simply perform the power amplification by pulse-width modulation, rather than by using the delta-sigma modulator for the power amplification of audio signals.

However, even if the audio system as a whole is configured to operate based on digital signals only, it is necessary to perform digital-to-analog conversion for power amplification of audio signals at once. In that case, the power amplifier circuit would have to carry out complicated processing for effecting pulse-width modulation.

SUMMARY OF THE INVENTION

It is an object of the invention to provide a delta-sigma modulator that can increase the sampling frequency for analog-to-digital conversion without increasing the inverse frequency for 1-bit digital signals output from a clocked comparator corresponding to a 1-bit quantizer.

According to a first aspect of the invention, a delta-sigma modulator is configured by an integration circuit, a 1-bit quantizer, an output inversion inhibitor circuit, a delay circuit, and an adder. An analog signal is supplied to the integration circuit by way of the adder, wherein it is subjected to integration. An integration result is subjected to quantization by the 1-bit quantizer to produce 1-bit digital signals. The output inversion inhibitor circuit inhibits an output signal of the 1-bit quantizer from being re-inverted during a re-inversion inhibiting period corresponding to a preset number 'N' (where N≧2) of clock pulses counted after the timing when the output signal of the 1-bit quantizer is inverted. An output of the output inversion inhibitor circuit is delayed by one sample and is then fed back to the adder by way of the delay circuit.

According to a second aspect of the invention, a delta-sigma modulator is configured by at least a pair of an adder and a switched-capacitor integrator, a 1-bit quantizer, an output inversion inhibitor circuit, and a delay circuit. An analog signal is supplied to the switched-capacitor integrator by way of the adder, wherein it is subjected to integration. An integration result is subjected to quantization by the 1-bit quantizer to produce 1-bit digital signals. The output inversion inhibitor circuit inhibits an output signal of the 1-bit quantizer from being re-inverted during a re-inversion inhibiting period corresponding to a preset number 'N' (where N>2) of clock pulses counted after the timing when the output signal of the 1-bit quantizer is inverted. An output of the output inversion inhibitor circuit is delayed by one sample and is then fed back to the adder by way of the delay circuit.

In the above, the preset number 'N' is set to five, for example. Hence, the output inversion inhibitor circuit neglects a re-inversion of the output signal of the 1-bit quantizer unless five consecutive clock pulses are completely counted after the timing when the output signal of the 1-bit quantizer is inverted.

Due to the provision of the output inversion inhibitor circuit, it is possible to perform analog-to-digital conversion at the 'increased' sampling frequency without increasing the inverse frequency for 1-bit digital signals output from the 1-bit quantizer, which acts as a clocked comparator operating based on clock pulses.

BRIEF DESCRIPTION OF THE DRAWINGS

These and other objects, aspects and embodiments of the present invention will be described in more detail with reference to the following drawing figures, of which.

DESCRIPTION OF THE PREFERRED EMBODIMENTS

This invention will be described in further detail by way of examples with reference to the accompanying drawings.

Figure 1:
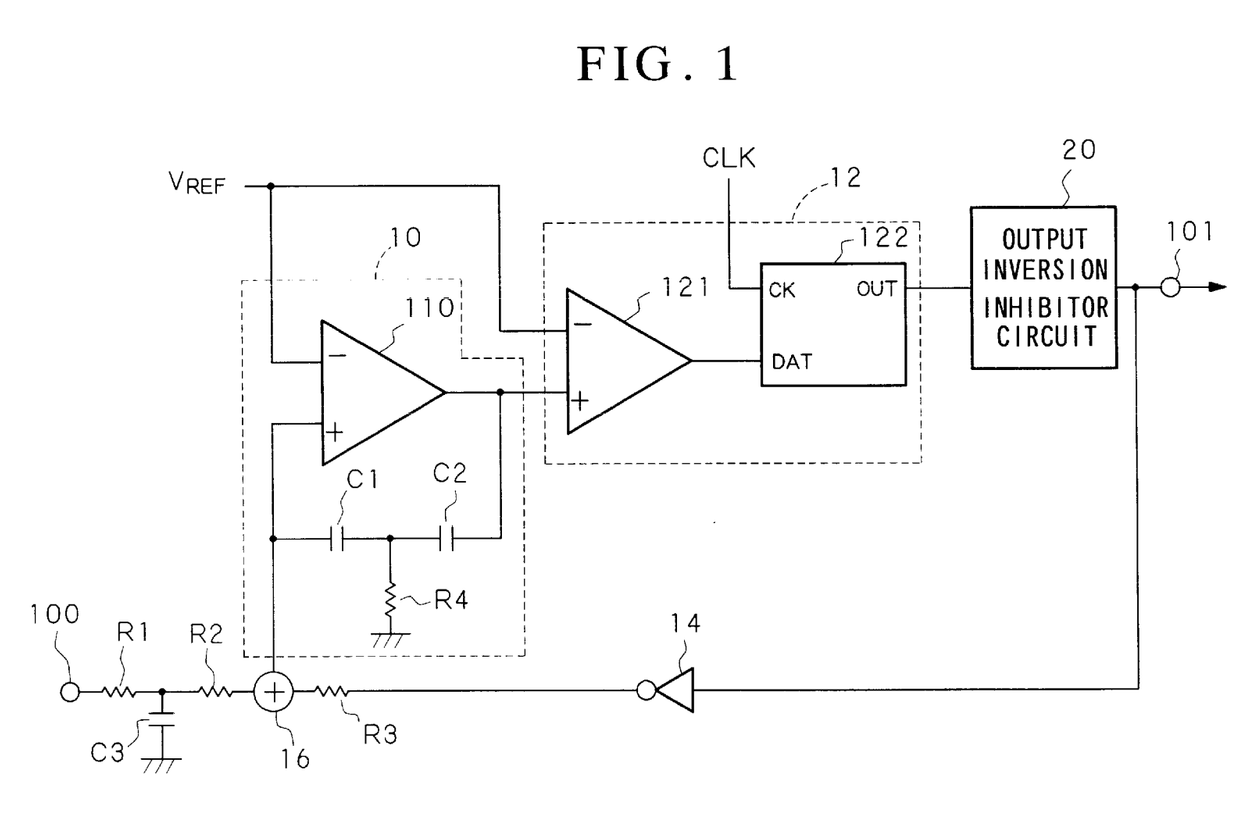
FIG. 1 is a circuit diagram containing function blocks that shows an electrical configuration of a delta-sigma modulator in accordance with a first embodiment of the invention.

FIG. 1 shows a configuration of a delta-sigma modulator in accordance with a first embodiment of the invention. In FIG. 1, an adder 16 adds together an analog signal input to a signal input terminal 100 and an output signal of an inverter 14 that acts as a delay circuit. An addition result of the adder is subjected to integration by an integration circuit 10. A 1-bit quantizer 12 produces 1-bit digital signals by performing quantization on an integration result of the integration circuit 10. In addition, an output inversion inhibitor circuit 20 inhibits 1-bit digital signals of the 1-bit quantizer 12 from being inverted again for a predetermined period of time. The 1-bit digital signals are fed back to the inverter 14 by way of the output inversion inhibitor circuit 20. That is, the inverter 14 delays each of the 1-bit digital signals by one sample. In other words, the inverter 14 inverts the signs of the 1-bit digital signals, which are then supplied to the adder 16.

The output inversion inhibitor circuit 20 operates in response to an inversion timing at which an output signal of the 1-bit quantizer 12 is inverted in logic (or level). That is, the output inversion inhibitor circuit 20 inhibits the output signal of the 1-bit quantizer 12 from being re-inverted during a preset period of time corresponding to the prescribed number of clock pulses being sequentially output after the inversion timing, which is equal to 'N' or less (where 'N' is a preset number and is not less than '2', that is, $N \geq 2$).

The integration circuit 10 is configured by an operational amplifier 110, capacitors C1 and C2 which are used for integration, and a resistor R4.

The 1-bit quantizer 12 is a clocked comparator that is. configured by a comparator 121 and a latch circuit 122. The latch circuit 122 operates in synchronization with clock pulses (CLK) having a clock frequency $f_{CLK}$. Suppose that the delta-sigma modulator deals with digital signals whose sampling frequency fs is 48 kHz, which are converted to multi-bit digital signals by a decimation circuit that is connected subsequent to the delta-sigma modulator. In that case, the clock frequency $f_{CLK}$ is set to approximately 6 MHz, that is, 128 fs. Incidentally, reference numeral 101 denotes a signal output terminal. In addition, resistors R2 and R3 are provided for signal level adjustment. Further, a resistor R1 and a capacitor C3 configure a filter for removing noise from an input signal applied to the signal input terminal 100.

In the delta-sigma modulator of FIG. 1, noise components are removed from an analog signal input to the signal input terminal 100 by the aforementioned filter that is configured by the resistor R1 and capacitor C3. The input analog signal is supplied to the adder 16 by way of the filter for the elimination of noise. The adder 16 also receives a 1-bit digital signal that corresponds to a preceding sample and is inverted in sign (i.e., logic or level). Therefore, the adder 16 adds together the noise-eliminated input analog signal and the 1-bit digital signal. An addition result is forwarded to the integration circuit 10. The integration circuit 10 performs integration based on the addition result output from the adder 16, so that an integration result is produced and is supplied to a noninverting input of the comparator 121 within the 1-bit quantizer 12.

The 1-bit quantizer 12 performs quantization on the integration result output from the integration circuit 10. Here-in, the integration result is converted to a series of 1-bit digital signals in synchronization with the clock pulses (CLK). Specifically, the comparator 121 compares the integration result of the integration circuit 10 with reference voltage $V_{REF}$. The comparator 121 outputs logic 1 when the integration result is equal to the reference voltage $V_{REF}$ or more, and it outputs logic 0 when the integration result is less than the reference voltage $V_{REF}$. Such a binary signal (or 1-bit data) whose logic is 1 or 0 is supplied to a data terminal DAT of the latch circuit 122. In synchronization with the clock pulses (CLK) supplied to a clock terminal CK, the latch circuit 122 latches the 1-bit data supplied to the data terminal DAT. The latched 1-bit data is retained for a while until a next clock pulse is to be input to the clock terminal CK. Then, the latched 1-bit data is output from an output terminal OUT and is supplied to the output inversion inhibitor circuit 20.

The output inversion inhibitor circuit 20 outputs a 1-bit digital signal based on the 1-bit data output from the 1-bit quantizer 12. The 1-bit digital signal is then delayed by one sample and is also inverted in polarity by the inverter 14. The 'delayed and inverted' 1-bit digital signal is fed back to the adder 16. Thus, the adder 16 adds such 1-bit digital signal to the input analog signal. An addition result is supplied to the integration circuit 10.

It is described above that clock pulses are counted after the inversion timing at which an output signal of the 1-bit quantizer 12 is inverted. As long as the number of clock pulses counted from the inversion timing does not exceed the preset number N (where N≧2), the output inversion inhibitor circuit 20 inhibits the output signal of the 1-bit quantizer 12 from being re-inverted. Thus, it is possible to inhibit an output signal of the delta-sigma modulator from being re-inverted during the predetermined period of time until the number of clock pulses counted after the inversion timing reaches the preset number N.

Next, an internal configuration and operation of the output inversion inhibitor circuit 20 will be described with reference to FIG. 2 and FIGS. 3A–3I. Specifically, FIG. 2 shows the internal configuration of the output inversion inhibitor circuit 20 in a concrete manner, and FIGS. 3A–3I are time charts that are used to explain operating states of the output inversion inhibitor circuit 20.

Figure 2:
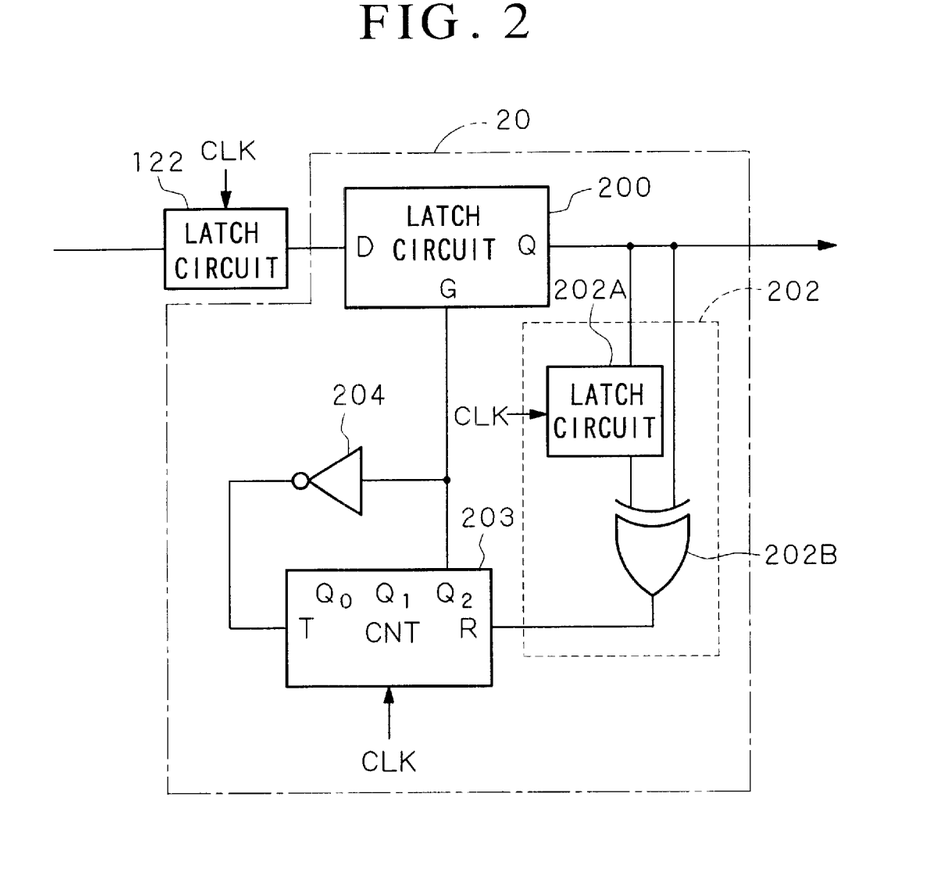
FIG. 2 is a circuit diagram containing function blocks, which shows an example of an internal configuration of an output inversion inhibitor circuit shown in FIG. 1.

In the output inversion inhibitor circuit 20 shown in FIG. 2, a latch circuit 200 temporarily retains an output signal of the 1-bit quantizer 12 (specifically, an output signal of the latch circuit 122) in synchronization with clock pulses (CLK). An output state detection circuit 202 detects the state of variation of an output signal of the latch circuit 200. A counter circuit (CNT) 203 performs count operations in synchronization with clock pulses (CLK). An inverter 204 controls the counter circuit 203 to start or stop its counting operation.

In the output state detection circuit 202, a latch circuit 202A temporarily retains 1-bit data output from the latch circuit 200 in synchronization with clock pulses (CLK). An exclusive-or circuit 202B performs an exclusive-or logical operation based on the output of the latch circuit 200 and the output of the latch circuit 202A.

When the output of the latch circuit 200 changes in state, the output state detection circuit 202 produces a reset signal, which is supplied to a reset terminal R of the counter circuit 203.

The counter circuit 203 is a 3-bit counter circuit, which is reset by the reset signal output from the output state detection circuit 202. Then, the counter circuit 203 starts to count clock pulses. At a time when the number of the clock pulses counted by the counter circuit 203 reaches the preset number N (where N≧2), the counter circuit 203 produces and outputs a control signal to a control terminal G of the latch circuit 200. Due to the control signal, the latch circuit 200 is controlled to directly output 1-bit data, which is output from the 1-bit quantizer 12 and is input to the latch circuit 200, therefrom.

Figure 3A:
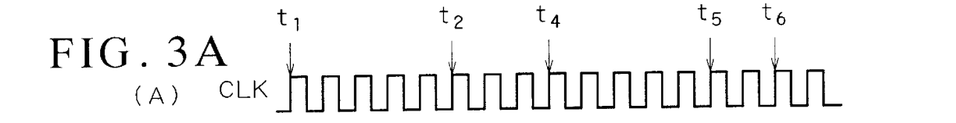
FIG. 3A is a time chart showing clock pulses (CLK)

The control signal varies between a low-level signal and a high-level signal. When a low-level signal is supplied to the control terminal G of the latch circuit 200, no change occurs at an output terminal Q of the latch circuit 200. That is, the latch circuit 200 presently retains the data there-in. When a high-level signal is supplied to the control terminal G, the latch circuit 200 directly outputs data, which is input to an input terminal D thereof, from the output terminal Q thereof Next, the concrete operation of the output inversion inhibitor circuit 20 will be described with reference to time charts of FIGS. 3A to 3I. The output inversion inhibitor circuit 20 inhibits the output signal of the 1-bit quantizer 12 from being re-inverted during a re-inversion inhibiting period, which is counted from the timing when the output signal of the 1-bit quantizer 12 is inverted and is defined by the preset number N representing the prescribed number of clock pulses. The present embodiment sets the preset number N to '5', i.e., N=5, for example. FIG. 3A shows clock pulses (CLK), which periodically emerge in an elapse of time. FIGS. 3B, 3D, 3F and 3H (see symbols B-1, C-1, D-1 and E-1) show various types of output signals of the 1-bit quantizer 12, i.e., input signals of the output inversion inhibitor circuit 20. In addition, FIGS. 3C, 3E, 3G and 3I (see symbols B-2, C-2, D-2 and E-2) show various types of output signals of the output inversion inhibitor circuit 20.

Figures 3B, 3C:
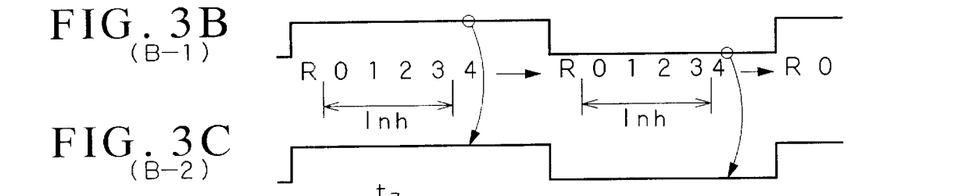
FIG. 3B is a time chart showing an output signal (B-1) of a 1-bit quantizer, which is input to the output inversion inhibitor circuit shown in FIG. 2.
FIG. 3C is a time chart showing an output signal (B-2) of the output inversion inhibitor circuit in response to the signal shown in FIG. 3B.

In FIGS. 3B, 3D, 3F and 3H, reference symbol 'Inh' represents the re-inversion inhibiting period in which the output signal of the 1-bit quantizer 12 is inhibited from being re-inverted after it is once inverted. In addition, reference symbol 'R' represents a reset timing, and numerals such as '0', '1', '2', '3', and '4' represent the numbers of clock pulses that are counted by the counter circuit 203 after being reset. The output signal of the 1-bit quantizer 12 is sustained at the same level in synchronization with clock pulses (CLK) as shown in FIGS. 3B, 3D, 3F and 3H, wherein it is changed between two levels, namely the high level and the low level corresponding to logic 1 and logic 0 respectively. FIG. 3B shows that the output signal of the 1-bit quantizer 12, which is output from the latch circuit 122 shown in FIG. 2, is continuously sustained at the same logic 1 or 0 during five consecutive clock pulses or more.

In response to the output signal (B-1) of the latch circuit 122 shown in FIG. 3B, the output inversion inhibitor circuit 20 produces an output signal (B-2) shown in FIG. 3C. At time t1 when an input signal of the latch circuit 200 is inverted so that it is changed in level from low to high, an output signal of the latch circuit 200 is correspondingly inverted and is output from the output terminal Q, while the latch circuit 202A continuously retains the previous output state of the latch circuit 200. The exclusive-or circuit 202B performs an exclusive-or operation on the output of the latch circuit 200 and the output of the latch circuit 202A, which do not coincide with each other. Hence, the exclusive-or circuit 202B produces a high-level signal, which is supplied to the reset terminal R of the counter circuit 203 as a reset signal. Due to the reset signal, the counter circuit 203 is reset so that its count content is cleared. At this time, the counter circuit 203 outputs from its output terminal Q2 a low-level signal, which is then inverted in level by the inverter 204. Therefore, a high-level signal from the inverter 204 is input to a trigger terminal T of the counter circuit 203 to start its counting operation.

At time t2 when the counter circuit 203 has completely counted five clock pulses (CLK) after the reset timing, it outputs from the output terminal Q2 a high-level signal, which is supplied to the control terminal G of the latch circuit 200. In addition, such a high-level signal is also supplied to the inverter 204, wherein it is inverted in level and is then input to the trigger terminal T of the counter circuit 203. Due to the low-level signal being output from the inverter 204, the counter circuit 203 stops its counting operation, so that it continuously outputs the high-level signal to the control terminal G of the latch circuit 200. For this reason, at time t2, the latch circuit 200 directly outputs the signal, which is input to the input terminal D, from the output terminal Q. At this time, the input signal of the latch circuit 200 remains at the high level, so that a high-level signal is directly output from the output terminal Q.

At time t4 when the input signal of the latch circuit 200 is inverted so that it is changed in level from high to low, the counter circuit 203 still supplies a high-level control signal to the control terminal G of the latch circuit 200 Hence, variations that occur at the input terminal D will be directly reflected on the output terminal Q of the latch circuit 200. That is, the output signal of the latch circuit 200 is changed in level from high to low. At the same time (i.e., t4), the exclusive-or circuit 202B produces a high-level output signal, by which the counter circuit 203 is reset so that its count content is cleared. Then, the counter circuit 203 restarts to count clock pulses (CLK).

After being reset at time t4, the counter circuit 203 counts clock pulses, the number of which reaches five at time t5. That is, when the counter circuit 203 has completely counted five clock pulses after the reset timing, it produces a high-level control signal, which is supplied to the control terminal G of the latch circuit 200. Therefore, the signal of the input terminal D is directly output from the output terminal Q of the latch circuit 200. At this time, the input signal is set to the low level, so that the output signal of the latch circuit 200 remains at the low level. Due to the high-level signal from the output terminal Q2, a low-level signal is input to the trigger terminal T of the counter circuit 203 by way of the inverter 204. Therefore, the counter circuit 203 stops its counting operation, so that it continuously outputs the high-level control signal to the control terminal G of the latch circuit 200. At time t6, the input signal of the latch circuit 200 is inverted so that it is changed in level from low to high. Variations that occur at the input terminal D are directly reflected on the output terminal Q of the latch circuit 200. That is, the output signal of the latch circuit 200 is correspondingly inverted so that it is changed in level from low to high.

Figures 3D, 3E:
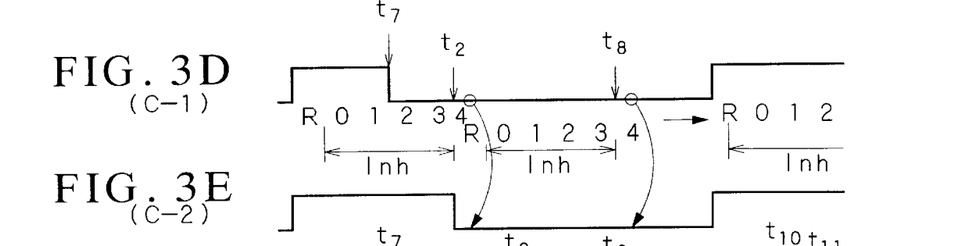
FIG. 3D is a time chart showing an output signal (C-1) of the 1-bit quantizer.
FIG. 3E is a time chart showing an output signal (C-2) of the output inversion inhibitor circuit in response to the signal shown in FIG. 3D.

FIG. 3D shows that the output signal (C-1) of the 1-bit quantizer 12, which is output from the latch circuit 122 shown in FIG. 2, is continuously sustained at the logic 1by five consecutive clock pulses or less, and then it is continuously sustained at the logic 0 by five consecutive clock pulses or more. In response to the signal (C-1) output from the latch circuit 122, the output inversion inhibitor circuit 20 produces an output signal (C-2) shown in FIG. 3E. With respect to the aforementioned signals (C-1 and C-2) shown in FIGS. 3D and 3E, the output inversion inhibitor circuit 20 performs similar operations, which have been already described with respect to the foregoing signals (B-1 and B-2) shown in FIGS. 3B and 3C. Hence, the present specification does not repeat details of the aforementioned operations of the output inversion inhibitor circuit 20. Incidentally, it is possible to similarly describe the operation of the output inversion inhibitor circuit 20 with respect to other signals, namely D-1, D-2, E-1 and E-2 shown in FIGS. 3F, 3G, 3H and 3I.

With reference to FIG. 3D, the output signal (C-1) of the 1-bit quantizer 12 is inverted so that it is changed in level from high to low at time t7. By the time t7, the counter circuit 203 has completely counted three clock pulses (CLK) after the reset timing corresponding to the foregoing time t1. Therefore, the output signal of the latch circuit 200 does not change at time t7 even if the aforementioned signal (C-1) is changed in level from high to low. That is, the output signal of the latch circuit 200 is still sustained at the high level. At time t2 when the counter circuit 203 has completely counted five clock pulses after the reset timing t1, the output signal of the latch circuit 200 is inverted so that it is changed in level from high to low. In addition, the counter circuit 203 is reset at time t2.

At time t8 when the counter circuit 203 has completely counted five clock pulses (CLK) after the reset timing t2, the output signal of the 1-bit quantizer 12 still remains at the low level. Because no change occurs in the output signal of the latch circuit 122, no change occurs in the output signal of the latch circuit 200. That is, the output signal of the latch circuit 200 still remains at the low level.

Figures 3F, 3G:
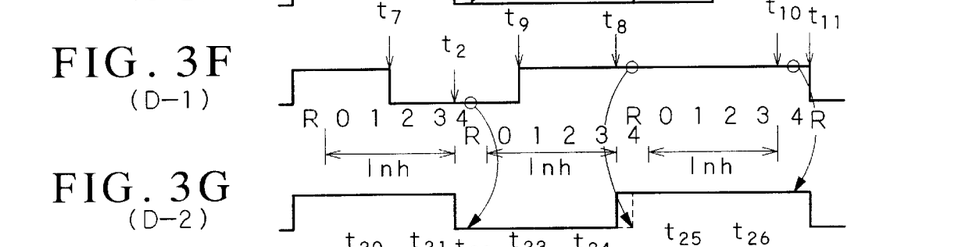
FIG. 3F is a time chart showing an output signal (D-1) of the 1-bit quantizer.
FIG. 3G is a time chart showing an output signal (D-2) of the output inversion inhibitor circuit in response to the signal shown in FIG. 3F.

FIG. 3F shows that the output signal (D-1) of the 1-bit quantizer 12, which is output from the latch circuit 122, is continuously sustained at logic 1or 0 by five consecutive clock pulses or less. In response to the aforementioned signal (D-1) shown in FIG. 3F, the output inversion inhibitor circuit 20 produces and outputs a signal (D-2) shown in FIG. 3G. FIG. 3G shows that the output signal of the output inversion inhibitor circuit 20 is varied in level to follow up with variations of the output signal of the 1-bit quantizer 12, that is, inverting operations of the 1-bit quantizer 12.

With reference to FIG. 3F, after the foregoing time t1 when the counter circuit 203 is reset, the output signal of the 1-bit quantizer 12 is inverted so that it is changed in level from high to low at time t7. At this time t7, the counter circuit 203 counts three clock pulses after time t1. Hence, the output signal of the latch circuit 200 still remains at the high level at time t7. At time t2 when the counter circuit 203 has completely counted five clock pulses, the latch circuit 200 is controlled in such a manner that the output signal of the 1-bit quantizer 12 input to the input terminal D is directly output from the output terminal Q of the latch circuit 200. Because the output signal of the 1-bit quantizer 12 is set to a low level at time t2, the output signal of the latch circuit 200 is inverted so that it is changed in level from high to low, and the counter circuit 203 is reset as well.

At time t9 when the output signal of the 1-bit quantizer 12 is inverted so that it is changed in level from low to high, the counter circuit 203 counts two clock pulses after the reset timing t2. Therefore, the output signal of the latch circuit 200 still remains at the low level. At time t8 when the counter circuit 203 completely counts five clock pulses after time t2, the output signal of the latch circuit 200 is inverted so that it is changed in level from low to high, and the counter circuit 203 is reset as well.

At time t10 when the counter circuit 203 has completely counted five clock pulses after the reset timing t8, the latch circuit 200 is controlled in such a manner that the output signal of the 1-bit quantizer 12 input to the input terminal D is directly output from the output terminal Q of the latch circuit 200. At time t10, the output signal of the 1-bit quantizer 12 is still sustained at the high level, therefore, the output signal of the latch circuit 200 is correspondingly sustained at the high level. At time t11 when the output signal of the 1-bit quantizer 12 is inverted so that it is changed in level from high to low, the output signal of the latch circuit 200 is correspondingly inverted so that it is changed in level from high to low as well.

Figures 3H, 3I:
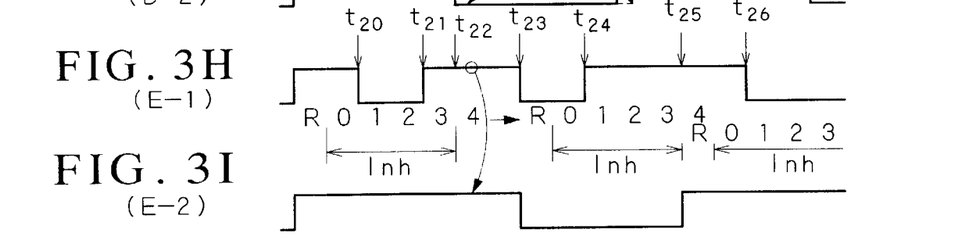
FIG. 3H is a time chart showing an output signal (E-1) of the 1-bit quantizer.
FIG. 3I is a time chart showing an output signal (E-2) of the output inversion inhibitor circuit in response to the signal shown in FIG. 3H.

Next, FIG. 3H shows that the output signal (E-1) of the 1-bit quantizer 12 is continuously sustained at logic 1or 0 by five consecutive clock pulses or less. In response to the aforementioned signal (E-1) shown in FIG. 3H, the latch circuit 200 produces and outputs a signal (E-2) shown in FIG. 3I. FIG. 3I shows that the latch circuit 200 neglects variations of the output signal of the 1-bit quantizer 12, which is sustained at the same level (i.e., logic 1or 0) for less than five clock pulses, that is, inverting operations of the output inversion inhibitor circuit 20.

With reference to FIG. 3H, after the foregoing time t1 when the counter circuit 203 is reset, the counter circuit 203 counts two clock pulses at time t20. At this time t20, the output signal of the 1-bit quantizer 12 is inverted so that it is changed in level from high to low. At time t21, the output signal of the 1-bit quantizer 12 is inverted again so that it is changed in level from low to high. Both the times t20 and t21 fall within the re-inversion inhibiting period because the number of clock pulses counted by the counter circuit 203 does not reach five. Therefore, the latch circuit 200 neglects inversions of the output signal of the 1-bit quantizer 12 that occur at times t20 and t21 respectively. For this reason, the signal (E-2) output from the output terminal Q of the latch circuit 200 is continuously sustained at the high level during the period of time that lies between time t1 and time t21.

At time t22, the counter circuit 203 has completely counted five clock pulses after the reset timing t1. At this time t22, the latch circuit 200 is controlled in such a manner that the output signal of the 1-bit quantizer 12 input to the input terminal D is directly output from the output terminal Q of the latch circuit 200. At time t22, the output signal of the 1-bit quantizer 12 is sustained at the high level, so that the output signal of the latch circuit 200 is still sustained at the high level. At time t23 when the output signal of the 1-bit quantizer 12 is inverted so that it is changed in level from high to low, the output signal of the latch circuit 200 is correspondingly inverted so that it is changed in level from high to low as well, and the counter circuit 203 is being reset.

After the reset timing t23, the counter circuit 203 counts two clock pulses at time t24, at which the output signal of the 1-bit quantizer 12 is inverted so that it is changed in level from low to high. The period of time that lies between the time t23 and time t24 belongs to the re-inversion inhibiting period. Therefore, the latch circuit 200 neglects inversion of the output signal of the 1-bit quantizer 12 at time t24. Hence, the output signal of the latch circuit 200 is maintained at the low level, regardless of the inversion of the output signal of the 1-bit quantizer 12 at time t24.

After the reset timing t23, the counter circuit 203 has completely counted five clock pulses at time t25, the latch circuit 200 is controlled in such a manner that the output signal of the 1-bit quantizer 12 input to the input terminal D is directly output from the output terminal Q of the latch circuit 200. At this time t25, the output signal of the 1-bit quantizer 12 is sustained at the high level, therefore, the output signal of the latch circuit 200 is inverted so that it is changed in level from low to high. In addition, the counter circuit 203 is reset at time t25, and then the counter circuit 203 starts its counting operation.

At time t26, the output signal of the 1-bit quantizer 12 is inverted again so that it is changed in level from high to low. The period of time that lies between the time t25 and time t26 fall within the re-inversion inhibiting period. Hence, the latch circuit 200 neglects inversion of the output signal of the 1-bit quantizer 12 at time t26. Therefore, the output signal of the latch circuit 200 is still sustained at the high level, regardless of the inversion of the output signal of the 1-bit quantizer 12 at time t26.

As described above, the delta-sigma modulator of the present embodiment is characterized by providing the output inversion inhibitor circuit 20 subsequently to the 1-bit quantizer 12. Here-in, the output inversion inhibitor circuit 20 operates to selectively allow or disallow inversions of 1-bit digital signals output from the 1-bit quantizer 12. That is, the output inversion inhibitor circuit 20 inhibits 1-bit digital signals from being re-inverted unless the prescribed period corresponding to at least five clock pulses has elapsed after the timing at which outputs of the 1-bit quantizer 12 are inverted. For this reason, the delta-sigma modulator does not necessarily increase the maximal inverse frequency although the clock frequency should be increased. In addition, it is possible to reduce the switching loss in high power switching of the output of the 1-bit quantizer 12. Thus, it is possible to eliminate the problem of electromagnetic wave radiation due to high-speed switching.

Figure 4:
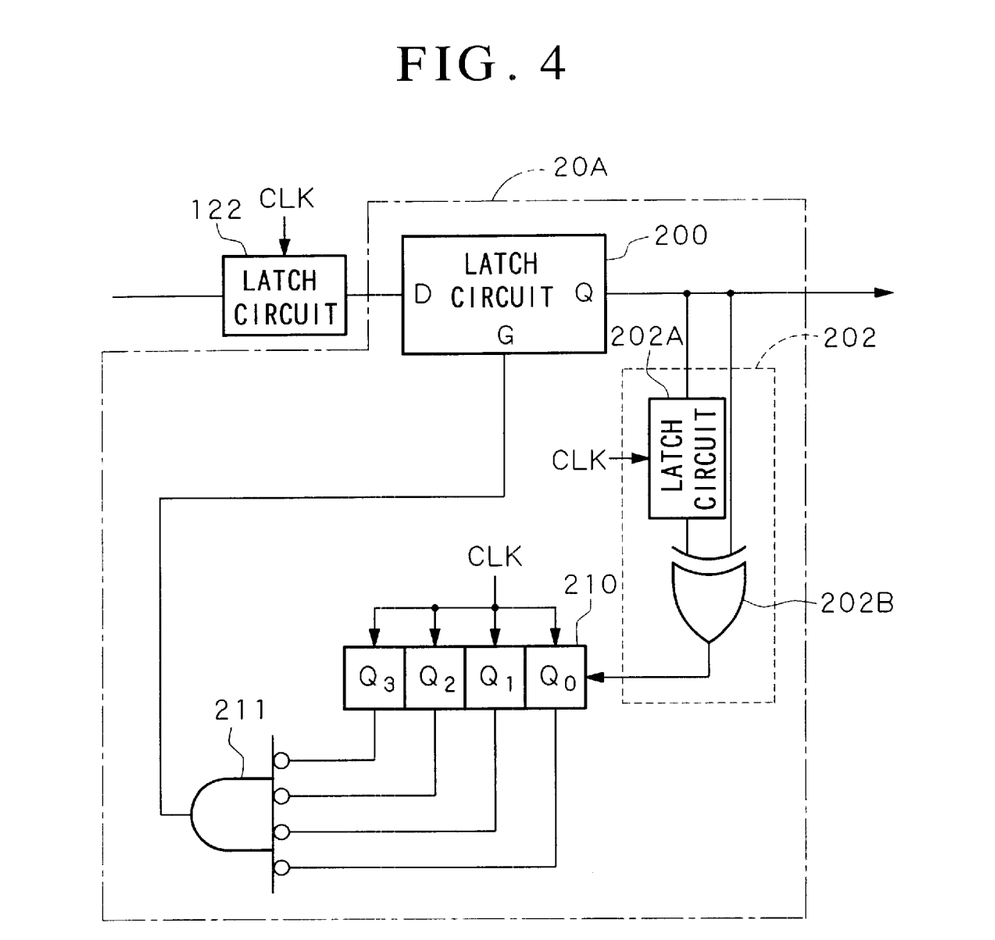
FIG. 4 is a circuit diagram containing function blocks, which shows a modified example of the internal configuration of the output inversion inhibitor circuit.

FIG. 4 shows another example of the first embodiment modified with respect to the internal configuration of an output inversion inhibitor circuit 20A. As compared with the output inversion inhibitor circuit 20 shown in FIG. 2, the output inversion inhibitor circuit 20A is characterized by replacing the counter circuit 203 and inverter 204 with a shift register 210 and a logic circuit (namely, a NOR circuit) 211. Similarly to the counter circuit 203, the shift register 210 and NOR circuit 211 contribute to the production of the control signal that is supplied to the control terminal G of the latch circuit 200 to define the re-inversion timing after the inversion timing of the output of the 1-bit quantizer 12. Other circuit elements of the output inversion inhibitor circuit 20A are identical to those of the output inversion inhibitor circuit 20; hence, they are not described to avoid duplicate descriptions in the present specification.

In the output inversion inhibitor circuit 20A shown in FIG. 4, the latch circuit 200 temporarily retains an output signal of the 1-bit quantizer 12, which is output from the latch circuit 122 and is input to the input terminal D. The output state detection circuit 202 produces a state detection signal representing a variation of an output signal of the latch circuit 200. The shift register 210 inputs the state detection signal from the output state detection circuit 202 as input data. Every time a clock pulse (CLK) is supplied to the shift register 210, the shift register 210 shifts the input data thereof by one bit. FIG. 4 shows that the shift register 210 is configured by (N-1) bits (where N=5), for example. That is, the shift register 210 is configured by four bits, which are denoted by symbols $Q_0$, $Q_1$, $Q_2$, and $Q_3$ linearly arranged in the prescribed order. The NOR circuit 211 performs a logical operation of NOR on the four bits $Q_0$ to $Q_3$ of the shift register 210.

Similarly to the output inversion inhibitor circuit 20, the output inversion inhibitor circuit 20A receives 1-bit digital signals (i.e., 1-bit data) that are output from the 1-bit quantizer 12 by way of the latch circuit 122. The latch circuit 200 temporarily latches the 1-bit data, which are then output to the output state detection circuit 202. In the output state detection circuit 202, the latch circuit 202A temporarily retains the 1-bit data output from the latch circuit 200 in synchronization with clock pulses (CLK). The exclusive-or circuit 202B performs an exclusive-or operation on the output of the latch circuit 200 and the output of the latch circuit 202A.

The NOR circuit 211 produces a control signal based on the four bits $Q_0$–$Q_3$ of the shift register 210 that receives the state detection signal to be shifted in position in response to the clock pulses (CLK). The NOR circuit 211 supplies the control signal to the control terminal G of the latch circuit 200. Thus, the latch circuit 200 is controlled in such a manner that the 1-bit data, which is output from the 1-bit quantizer 12 and is input to the input terminal D, is directly output from the output terminal Q of the latch circuit 200 at a specific timing at which the prescribed number 'N' of clock pulses have been counted after the state detection signal of the output state detection circuit 202 is input to the shift register 210.

First, an output signal of the 1-bit quantizer 12 is input to the input terminal D and is temporarily retained by the latch circuit 200, while the output state detection circuit 202 monitors the state of an output of the latch circuit 200. When a variation occurs in the output signal of the 1-bit quantizer 12, it is reflected in the output of the latch circuit 200 and is detected by the output state detection circuit 202. Thus, the output state detection circuit 202 produces a state detection signal representing the variation of the output of the latch circuit 200, which is supplied to the shift register of (N−1) bits. The state detection signal is initially located at the bit $Q_0$ that is the lowermost bit of the shift register 210, and then it is sequentially shifted leftwards by one bit every time a clock pulse (CLK) is counted. Initially, the combination of the four bits $Q_3$ to $Q_0$ is expressed as '0,0,0,1', wherein the position of digit 1 is sequentially shifted leftwards for every clock pulse being counted. As long as the digit 1 is included in the four bits $Q_3$–$Q_o$ of the shift register 210, the output of the NOR circuit 211 is at the low logical level. When five clock pulses have been completely counted after the state detection signal is input to the shift register 210, all of the four bits $Q_3$ to $Q_0$ are the digits 0 (corresponding to the low logical level), so that the output of the NOR circuit 211 turns to the high logical level.

Thus, the NOR circuit 211 outputs a control signal having a high logical level (or logic 1), which is supplied to the control terminal G of the latch circuit 200. For this reason, when the prescribed number 'N' (where N=5) of clock pulses have been completely counted after the timing when the state detection signal is input to the shift register 210, the latch circuit 200 is controlled by the control signal in such a manner that the output signal of the 1-bit quantizer 12 input to the input terminal D is directly output from the output terminal Q of the latch circuit 200.

Basically, the delta-sigma modulator is configured by an integration circuit 10, a 1-bit quantizer 12, an inverter 14, and an adder 16, which are shown in FIG. 1. Here-in, the integration circuit 10 performs integration based on an addition result output from the adder 16, and the 1-bit quantizer 12 quantizes an integration result of the integration circuit 10 to produce 1-bit digital signals. The inverter 14 delays the 1-bit digital signals by one sample, and it also inverts them in polarity. Then, the adder 16 adds together an output of the inverter 14 and an analog signal input to the signal input terminal 100, so that the addition result is produced and is supplied to the integration circuit 10. The first embodiment is characterized by providing an output inversion inhibitor circuit 20 between an output of the 1-bit quantizer 12 and a signal output terminal 101, from which digital signals are to be output. Specifically, the output inversion inhibitor circuit 20 inhibits an output signal of the 1-bit quantizer circuit 12 from being re-inverted during the re-inversion inhibiting period corresponding to the preset number 'N' (where N≧=2) of clock pulses, which are counted after the timing at which the output signal of the 1-bit quantizer 12 is inverted. Thus, the 1-bit digital signal output from the 1-bit quantizer 12 is subjected to output inversion inhibiting process of the output inversion inhibitor circuit 20 and is then delivered to the inverter 14 and the signal output terminal 101. Due to the aforementioned configuration shown in FIG. 1, the delta-sigma modulator of the first embodiment is capable of performing analog-to-digital conversion with the 'increased' sampling frequency without increasing the inverse frequency of 1-bit data of the clocked comparator corresponding to the 1-bit quantizer 12.

Figure 5:
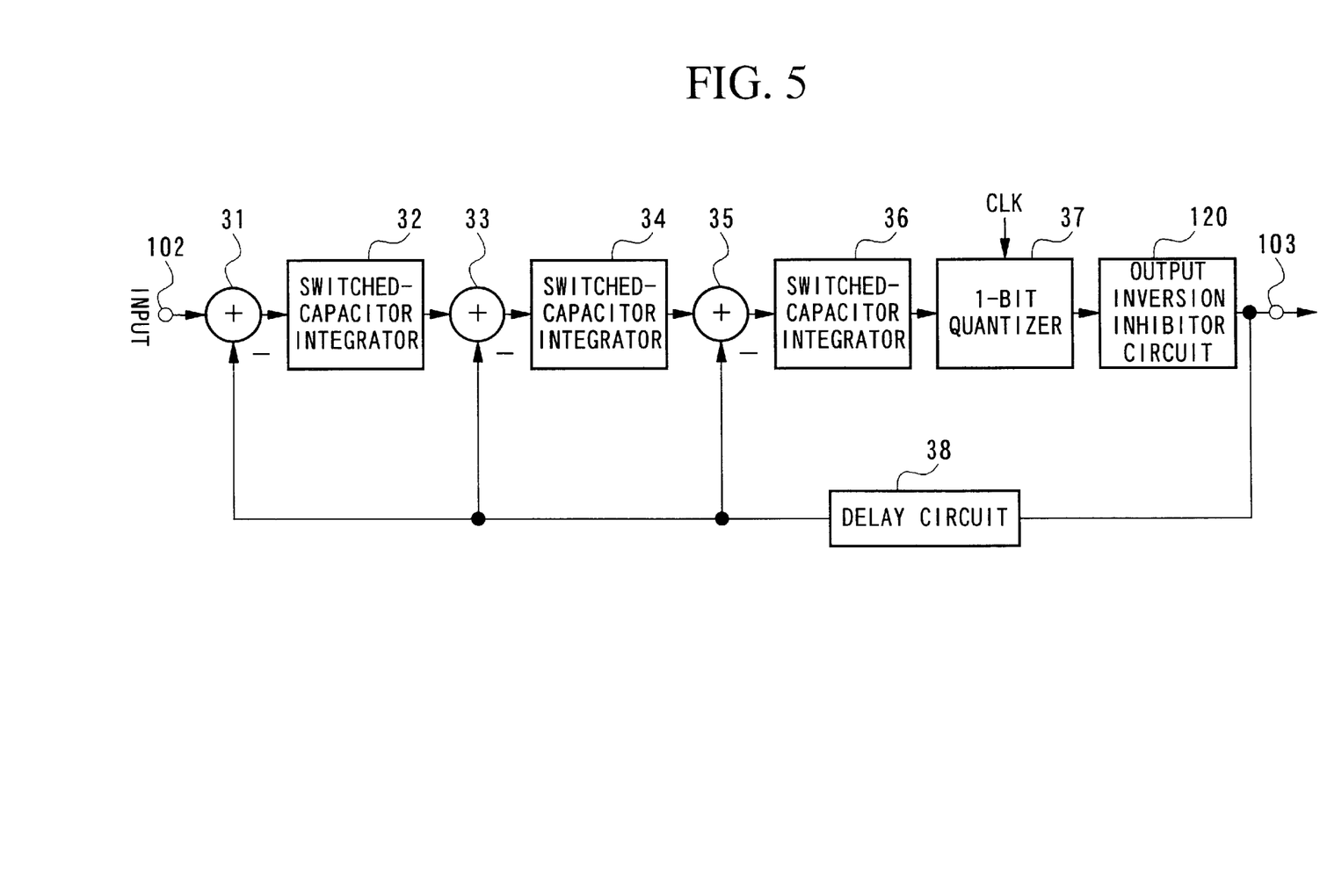
FIG. 5 is a block diagram showing an electrical configuration of a delta-sigma modulator in accordance with a second embodiment of the invention.

Next, a delta-sigma modulator of a second embodiment will be described with reference to FIGS. 5 and 6. FIG. 5 shows the overall configuration of the delta-sigma modulator of the second embodiment, which is designed to use three switched-capacitor integrators. The number of the switched-capacitor integrators for use in the delta-sigma modulator is not necessarily limited to three. Hence, the delta-sigma modulator of the second embodiment can be re-designed to use a single switched-capacitor integrator.

In the delta-sigma modulator of FIG. 5, three switched-capacitor integrators 32, 34 and 36 are connected together in series by way of three adders 31, 33 and 35. An analog signal input to a signal input terminal 102 is supplied to the switched-capacitor integrator 32 by way of the adder 31. That is, the input analog signal is sequentially subjected to integration, which is performed by each of the switched-capacitor integrators 32, 34 and 36 in series. Then, an integration result of the switched-capacitor integrator 36 is subjected quantization by a 1-bit quantizer 37, which in turn produces 1-bit digital signals. The 1-bit quantizer 37 is followed by an output inversion inhibitor circuit 120 that inhibits an output signal of the 1-bit quantizer 37 from being re-inverted during a re-inversion inhibiting period corresponding to a preset number 'N' (where N≧2) of clock pulses, which are counted after the timing at which the output signal of the 1-bit quantizer 37 is inverted. Thus, the output inversion inhibitor circuit 120 provides 1-bit digital signals, which are subjected to output inversion inhibiting process, to a signal output terminal 103. In addition, a delay circuit 38 feeds back 1-bit digital signals output from the output inversion inhibitor circuit 120 while delaying them by one sample. They are fed back to the adder 31 as feedback data.

Specifically, the adder 31 calculates the difference between the analog signal input to the signal input terminal 102 and the feedback data output from the delay circuit 38. The calculated difference is subjected to integration by the switched-capacitor integrator 32, an integration result of which is forwarded to the adder 33. The adder 33 calculates the difference between the integration result of the switched-capacitor integrator 32 and the feedback data. The calculated difference is subjected to integration by the switched-capacitor integrator 34, an integration result of which is forwarded to the adder 35. The adder 35 calculates the difference between the integration result of the switched-capacitor integrator 34 and the feedback data. The calculated difference is subjected to integration by the switched-capacitor integrator 36, an integration result of which is forwarded to the 1-bit quantizer 37 that is configured by a clocked comparator operating based on clock pulses (CLK). Thus, the 1-bit quantizer performs quantization on the integration result of the switched-capacitor integrator 36 to produce serial-bit signal strings, which are sequentially forwarded to the output inversion inhibitor circuit 120.

As described before, the output inversion inhibitor circuit 120 inhibits an output signal of the 1-bit quantizer 37 from being re-inverted during the re-inversion inhibiting period corresponding to the preset number 'N' (where N≧2) of clock pulses, which are counted after the timing at which the output signal of the 1-bit quantizer 37 is inverted. Thus, the output inversion inhibitor circuit 120 sequentially produces 1-bit digital signals, which are subjected to output inversion inhibiting process, based on the serial-bit signal strings output from the 1-bit quantizer 37. The 1-bit digital signals output from the output inversion inhibitor circuit 120 are supplied to the delay circuit 38 wherein they are delayed by one sample and are then delivered to the adders 31, 33 and 35 respectively as feedback data.

Figure 6:
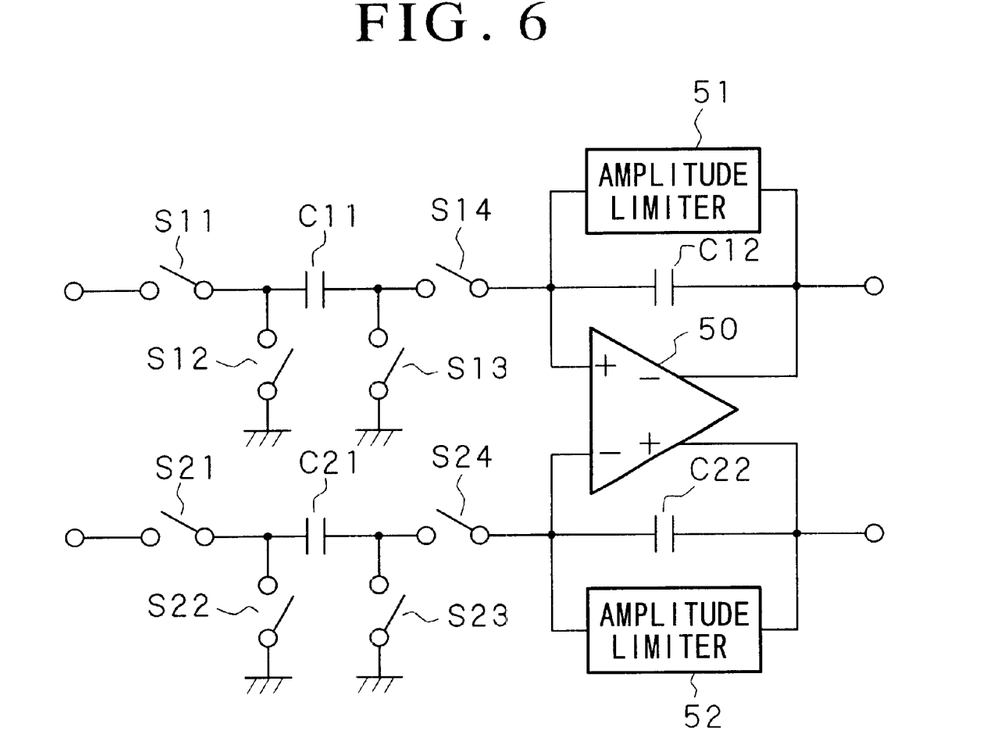
FIG. 6 is a circuit diagram showing an internal configuration of a switched-capacitor integrator that is used in the delta-sigma modulator shown in FIG. 5.

FIG. 6 shows an internal configuration of the switched-capacitor integrator 36 shown in FIG. 5. Concretely speaking, the switched-capacitor integrator 36 of FIG. 6 is configured as a switched-capacitor integrator of a differential output type using a CMOS operational amplifier 50.

In FIG. 6, four switching elements S11, S12, S13, S14 and two capacitors C11, C12 are arranged in connection with a noninverting input of the CMOS operational amplifier 50, while four switching elements S21, S22, S23, S24 and two capacitors C21, C22 are arranged in connection with an inverting input of the CMOS operational amplifier 50. Reference numerals 51 and 52 designate amplitude limiter circuits. The overall operation of the switched-capacitor integrator 36 shown in FIG. 6 is well known; hence, the description thereof will be omitted.

In addition, the output inversion inhibitor circuit 120 for use in the delta-sigma modulator of the second embodiment can be configured similarly to the foregoing output inversion inhibitor circuit 20, examples of the internal configuration of which are shown in FIGS. 2 and 4 respectively. Hence, the internal configuration of the output inversion inhibitor circuit 120 is not described to avoid duplicate descriptions in the present specification.

Basically, the delta-sigma modulator of the second embodiment uses the three switched-capacitor integrators 32, 34 and 36 that are connected in series by way of the three adders 31, 33 and 35, so that an integration result is subjected to quantization by the 1-bit quantizer 37, which in turn produces 1-bit digital signals. Then, the delay circuit 38 delays 1-bit digital signals output from the 1-bit quantizer 37 by one sample, so that 'delayed' digital signals are fed back as feedback data. The adder 31 adds together an analog signal, which is input to the signal input terminal 102, and the feedback data, so that an addition result is forwarded to the switched-capacitor integrator 32. The adder 33 adds the feedback data to an integration result of the integrator 32, so that an addition result is forwarded to the switched-capacitor integrator 34. The adder 35 adds the feedback data to an integration result of the integrator 34, so that an addition result is forwarded to the switched-capacitor integrator 36. The second embodiment is characterized by providing an output inversion inhibitor circuit 120 subsequently to the 1-bit quantizer 37, wherein the output inversion inhibitor circuit 120 inhibits an output signal of the 1-bit quantizer 37 from being re-inverted during the re-inversion inhibiting period corresponding to the preset number 'N' (where N≧2) of clock pulses counted after the timing at which the output signal of the 1-bit quantizer 37 is inverted. Thus, 1-bit digital signals, which are output from the 1-bit quantizer 37 and are subjected to output inversion inhibiting process, are delivered to the delay circuit 38 as well as the signal output terminal 103. Due to the provision of the output inversion inhibitor circuit 120 subsequent to the 1-bit quantizer 37, the delta-sigma modulator of the second embodiment is capable of performing analog-to-digital conversion at the 'increased' sampling frequency without increasing the inverse frequency of 1-bit digital signals of the clocked comparator corresponding to the 1-bit quantizer 37.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A delta-sigma modulator comprising:
   an integration circuit for performing integration with respect to an input analog signal;
   a 1-bit quantizer for quantizing an integration result of the integration circuit to produce 1-bit digital signals;
   an output inversion inhibitor circuit for inhibiting an output signal of the 1-bit quantizer from being re-inverted during a re-inversion inhibiting period corresponding to a preset number 'N' (where N≧2) of clock pulses that are counted after a timing when the output signal of the 1-bit quantizer is inverted;
   a delay circuit for delaying the 1-bit digital signals, which are provided from the output inversion inhibitor circuit, by one sample, so that delayed signals are fed back; and
   an adder for adding the delayed signals fed back thereto with the input analog signal, so that an addition result is forwarded to the integration circuit.

2. A delta-sigma modulator according to claim 1, wherein the output inversion inhibitor circuit comprises
   a latch circuit for temporarily retaining the output signal of the 1-bit quantizer,
   an output state detection circuit for detecting a variation at an output of the latch circuit, so that the output state detection circuit produces a state detection signal representing the variation that occurs at the output of the latch circuit,
   a shift register of (N−1) bits (where N≧2) for inputting the state detection signal at a lowermost bit thereof and for sequentially shifting it by one bit every time a clock pulse arrives, and
   a logical circuit for performing a logical operation to produce a control signal based on the (N−1) bits of the shift register when a preset number 'N' of clock pulses have been completely counted after an timing when the shift register inputs the state detection signal from the output state detection circuit, so that the control signal controls the latch circuit to directly output the output signal of the 1-bit quantizer.

3. A delta-sigma modulator according to claim 2, wherein the logical circuit is configured as a NOR circuit that produces logic 1 when the state detection signal corresponding to digit 1 is sequentially shifted to pass from an uppermost bit of the (N−1) bits of the shift register when the preset number 'N' of clock pulses have been completely counted after the timing when the state detection signal is input to the lowermost bit of the shift register.

4. A delta-sigma modulator according to claim 1, wherein the output inversion inhibitor circuit comprises
   a latch circuit for temporarily retaining the output signal of the 1-bit quantizer,
   an output state detection circuit for detecting a variation that occurs at an output of the latch circuit, so that the output state detection circuit producing a reset signal when detecting the variation at the output of the latch circuit, and
   a counter circuit for counting a number of clock pulses after it is reset by the reset signal, so that when the count number reaches a preset number 'N' (where N≧2), the counter circuit produces a control signal that controls the latch circuit to directly output the output signal of the 1-bit quantizer.

5. A delta-sigma modulator according to claim 1, wherein the preset number 'N' is set to five.

6. A delta-sigma modulator comprising:

a switched-capacitor integrator for performing integration with respect to an input analog signal;

a 1-bit quantizer for quantizing an integration result of the switched-capacitor integrator to produce 1-bit digital signals;

an output inversion inhibitor circuit for inhibiting an output signal of the 1-bit quantizer from being re-inverted during a re-inversion inhibiting period corresponding to a preset number 'N' (where N≧2) of clock pulses that are counted after a timing when the output signal of the 1-bit quantizer is inverted;

a delay circuit for delaying the 1-bit digital signals, which are provided from the output inversion inhibitor circuit, by one sample, so that delayed signals are being fed back; and an adder for adding the delayed signals fed back thereto with the input analog signal, so that an addition result is forwarded to the switched-capacitor integrator.

* * * * *